United States Patent
Campbell et al.

(10) Patent No.: US 8,141,621 B2
(45) Date of Patent: Mar. 27, 2012

(54) APPARATUS AND METHOD FOR PROVIDING IN SITU COOLING OF COMPUTER DATA CENTERS DURING SERVICE CALLS

(75) Inventors: Levi A. Campbell, Poughkeepsie, NY (US); Richard C. Chu, Hopewell Junction, NY (US); Michael J. Ellsworth, Jr., Lagrangeville, NY (US); Madhusudan K. Iyengar, Woodstock, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 646 days.

(21) Appl. No.: 12/332,656

(22) Filed: Dec. 11, 2008

(65) Prior Publication Data

US 2010/0147490 A1 Jun. 17, 2010

(51) Int. Cl.
*F28F 27/00* (2006.01)

(52) U.S. Cl. .................. 165/200; 165/80.3; 165/104.33; 361/679.49; 361/696; 361/724; 454/184; 312/236

(58) Field of Classification Search .................... 165/73, 165/80.3, 104.33, 200; 361/688, 696, 724; 361/679.49, 679.51, 689–695, 697–700; 49/71; 454/184; 312/236
See application file for complete search history.

(56) References Cited

U.S. PATENT DOCUMENTS

| | | | | |
|---|---|---|---|---|
| 3,481,153 | A | * | 12/1969 | Hoyle .............................. 62/262 |
| 4,379,391 | A | * | 4/1983 | Rhee ............................... 62/408 |
| 5,877,938 | A | * | 3/1999 | Hobbs et al. ................... 361/724 |
| 6,134,109 | A | * | 10/2000 | Muller et al. ................... 361/700 |
| 6,164,369 | A | * | 12/2000 | Stoller ...................... 165/104.33 |
| 6,317,320 | B1 | * | 11/2001 | Cosley et al. .................. 361/695 |
| 6,470,698 | B2 | * | 10/2002 | Nishi et al. ...................... 62/239 |
| 6,896,612 | B1 | * | 5/2005 | Novotny ......................... 454/184 |
| 7,259,963 | B2 | * | 8/2007 | Germagian et al. ........... 361/695 |
| 7,385,810 | B2 | | 6/2008 | Chu et al. |
| 7,974,094 | B2 | * | 7/2011 | Hendrix et al. ................ 361/695 |
| 2004/0217072 | A1 | * | 11/2004 | Bash et al. ....................... 211/26 |
| 2005/0170770 | A1 | * | 8/2005 | Johnson et al. ................ 454/184 |
| 2005/0282485 | A1 | * | 12/2005 | Kato et al. ..................... 454/136 |
| 2006/0160484 | A1 | * | 7/2006 | Falk ............................... 454/195 |
| 2007/0171613 | A1 | * | 7/2007 | McMahan et al. ............. 361/695 |
| 2008/0068798 | A1 | * | 3/2008 | Hendrix et al. ................ 361/696 |

* cited by examiner

*Primary Examiner* — Cheryl J Tyler
*Assistant Examiner* — Thomas Y Ho
(74) *Attorney, Agent, or Firm* — Dennis Jung, Esq.; Kevin P. Radigan, Esq.; Heslin Rothenberg Farley & Mesiti P.C.

(57) ABSTRACT

An apparatus and method for cooling electronic components housed in a computer rack while performing maintenance operations is provided. The apparatus, in one embodiment, includes a heat exchange assembly disposed within an outlet door cover of the computer rack, having one or more perforations. One or more air moving device(s) are also disposed on the outlet door and activated by an activator when the door is opened such that the devices when activated force hot air into the heat exchanger. Cool air is then exhausted through a planar containment plate having a plurality of edges. The plate is secured to top of the outlet door along one of its edges.

14 Claims, 6 Drawing Sheets

APPARATUS AND METHOD FOR PROVIDING IN SITU COOLING OF COMPUTER DATA CENTERS DURING SERVICE CALLS

BACKGROUND OF THE INVENTION

1. Field of the Invention

This invention relates to cooling of computing system environments, and more particularly to an apparatus and system that enables in situ cooling using a rear door heat exchanger, especially during maintenance operations.

2. Description of Background

The industry trend has been to continuously increase the number of electronic components inside computing systems in order to achieve increases in processor performance. The increase in the number of electronic components, however, does not change the footprint of the computer system. Given this limited footprint, a continuous increase in the number of heat generating components creates challenging heat dissipation issues. These issues if not dealt with adequately, can harm the structural and data integrity of the computer system, making the effect felt both at a system and module level.

Conventionally, electronic packages or nodes in large environments, along with their associated electronics, are packaged in removable drawer configurations stacked within a rack or frame like housing structure. Cooling of the packages and components, in such cases is achieved by providing air flow in parallel paths and usually in a front-to-back direction. Air flow is often impelled by one or more air moving devices such as fans or blowers. In some cases it may be possible to provide increased air flow as needed, such as for power processor units. This objective is achieved through the use of a more powerful air moving device or by increasing the rotational speed of an existing one.

In addition to individual system heat dissipation issues in large computer installations, or data centers that house large banks of computer racks in close proximity, the heat dissipation issue is exacerbated even more. In such installations not only will the room air conditioning be challenged but the cost can be prohibitive.

An even greater problem occurring in data centers is that of air recirculation. Recirculation problems occur when some fraction of the heated air exiting from one rack is subsequently drawn into the air inlet of the same rack or a different nearby rack. This recirculation flow is complex in nature, leading to increased rack inlet temperatures that have been unaccounted for during server thermal design. In some cases, this sudden and unaccounted for increase can affect system integrity by causing electrical shorts and result in other problems occurring due to components exceeding their allowable operating temperatures.

In response to this problem, International Business Machines Corporation introduced Cool Blue technology including the rear door heat exchanger concept partly embodied in U.S. Pat. No. 7,385,810. That patent provides for method and apparatus that facilitates the cooling of an electronics rack employing a heat exchange assembly mounted to an outlet door cover hingedly affixed to an air outlet side of the rack. The heat exchange assembly includes a support frame, an air-to-liquid heat exchanger, and first and second perforated planar surfaces covering first and second main sides, respectively, of the air-to-liquid heat exchanger. The heat exchanger is supported by the support frame and includes inlet and outlet plenums disposed adjacent to the edge of the outlet door cover hingedly mounted to the rack. Each plenum is in fluid communication with a respective connect coupling, and the heat exchanger further includes multiple horizontally-oriented heat exchange tube sections each having a serpentine cooling channel with an inlet and an outlet coupled to the inlet plenum and outlet plenum, respectively. Fins extend from the heat exchange tube sections. However, this approach poses challenges especially during computer installation and service calls. With Cool Blue technology now becoming more pervasive, the present invention introduces enhancements to allow for an improved servicing of a rack including a rear door heat exchanger.

SUMMARY OF THE INVENTION

The shortcomings of the prior art are overcome and additional advantages are provided through the provision of an apparatus and associated method for cooling electronic components housed in a computer rack while performing maintenance operations. The apparatus, in one embodiment, comprises a heat exchange assembly disposed within an outlet door cover of the computer rack, having one or more perforations. One or more air moving device(s) disposed on the outlet door and activated by an activator when the door is opened force hot air through the heat exchanger. Cool air is then exhausted through a planar containment plate having a plurality of edges. The plate is secured to top of the outlet door along one of its edges. In an alternate embodiment, the plate is replaced by a three dimensional hinged rotating duct that is also secured to the rack.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DESCRIPTION OF THE INVENTION

Figure 1:
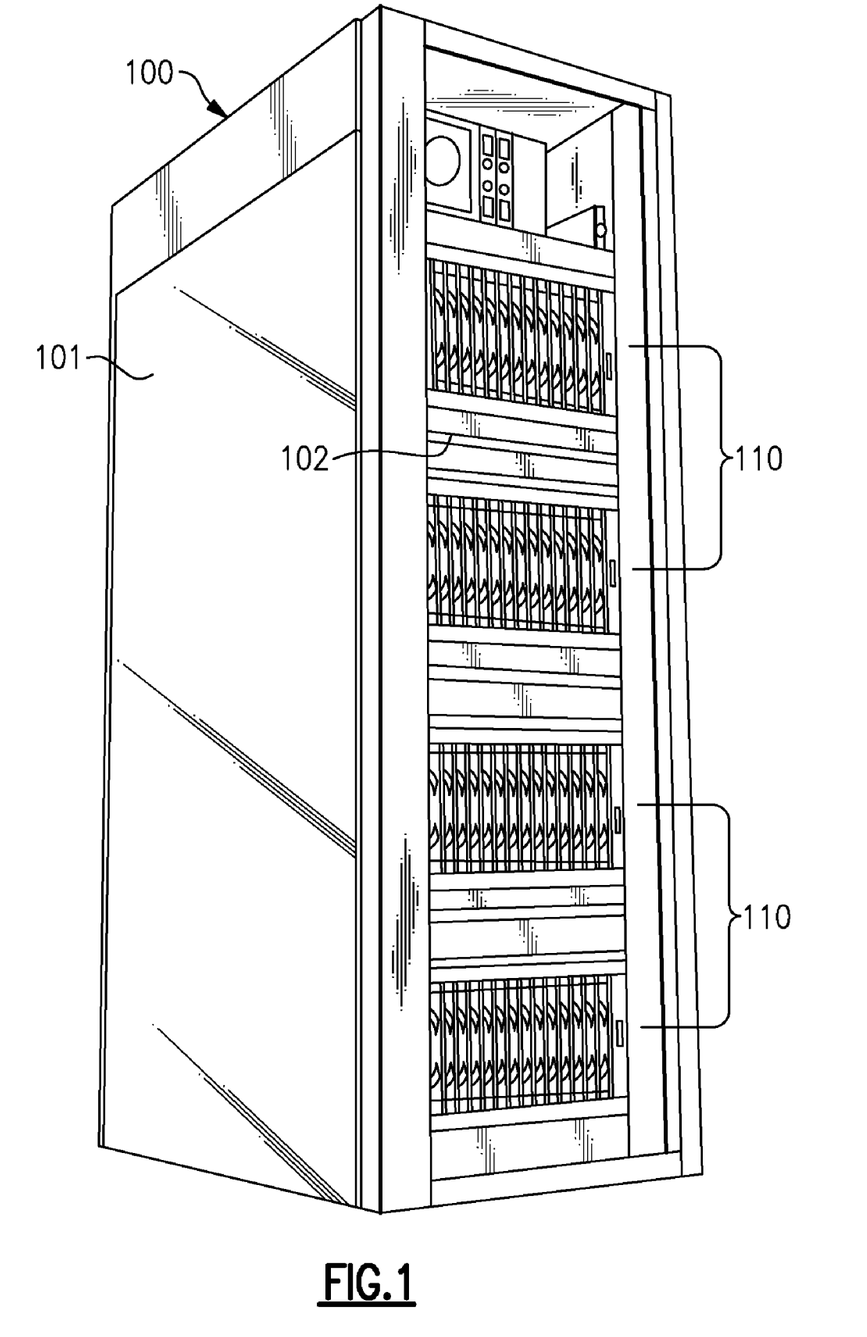
FIG. 1 is a perspective view illustration of a computer housing having a rack frame.

FIG. 1 is a perspective view illustration of a computer environment comprising a housing 100 having a frame 102, preferably with a rack or cage like structure as shown. The housing 100 can also incorporate full or partial doors or covers such as referenced by numerals 101.

It should be noted that as used herein, the term computer or electronic rack 102, hereinafter will be used for ease of reference but can be construed to include any housing, frame, rack, compartment, blade server system or other structural arrangements including any that may incorporate doors and/or covers. In addition, the computer rack 102 can be either a stand alone computer processor or a sophisticated system, having high, mid or low end processing capability.

In one embodiment, an electronics rack may comprise multiple electronic system chassis, each having one or more heat generating electronics systems disposed therein requiring cooling. In different embodiments, an electronic system chassis may be a multi-blade center system 110 with each blade being removable and stackable inside the rack 102. In this example, the electronic rack 102 comprises a stack of electronic system chassis or multi-blade center systems 110, as well as supporting power supplies, networking equipment and other similar and necessary components, not individually illustrated.

Figure 2:
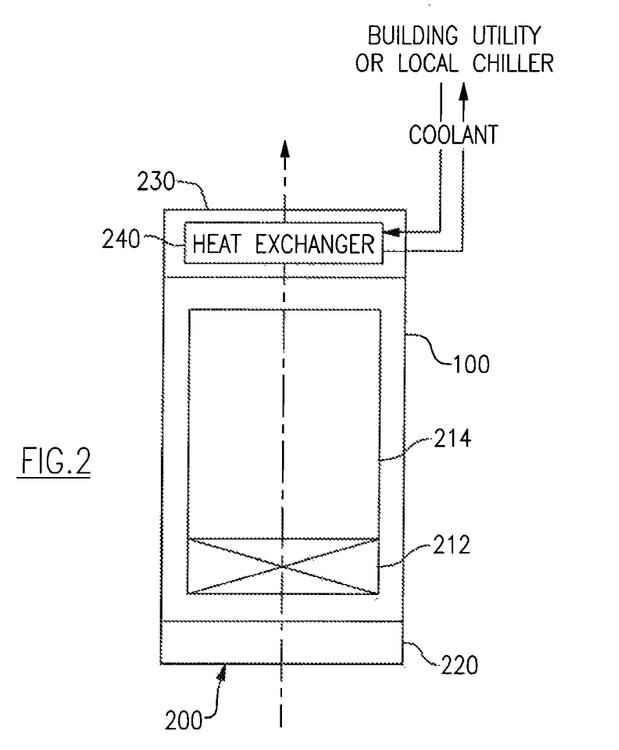
FIG. 2 is a top down schematic of an electronics rack with a heat exchange assembly disposed within an outlet door cover.

FIG. 2 is a top down schematic of the electronics rack 100, such as discussed in conjunction with FIG. 1, incorporating a heat exchange assembly 240 disposed within an outlet door cover 230. In FIG. 2, the to be cooled electronics and system disposed in the rack, is generally denoted by numerals 200. The rear door cooling unit, hereinafter referenced as a rear door heat exchanger, is similar to that used by International Business Machines Corporation in its Cool Blue technology. As shown, the electronics system 200 has an inlet door cover 220 and an outlet door cover 230 which have openings to allow for the ingress and egress of external air from the inlet side to the outlet side of the electronics rack 100. One or more air moving devices, such as fans and blowers, generally shown as 212 are provided for moving external air across at least one or more drawer units 214 positioned within the electronics rack. Disposed within outlet door cover 230 is a heat exchange assembly 240. Heat exchange assembly 240 includes an air-to-liquid heat exchanger through which the inlet-to-outlet air flow through the electronics rack passes. Coolants such as facility water or other refrigerants are provided to the heat exchange assembly 240. Heat exchange assembly 240 removes heat from the exhausted inlet-to-outlet air flow through the electronics rack for transfer via the coolant supplied. Advantageously, providing a heat exchange assembly with an air-to-liquid heat exchanger disposed at the outlet door cover of one or more electronics racks in a computer installation can significantly reduce heat loads on existing air conditioning units within the computer installation, and facilitate the cooling of the rack-mounted electronics units.

Data center facilities that house computer equipment represent a high capital investment and are often designed to function for at least a few years, often without any down time. The computer equipment is usually designed with the assumption of rack air inlet temperatures in the range of 24 to 35 degrees Celsius, typically. Although there are many different perspectives for optimizing such a computing facility, ensuring device reliability by delivering uninterrupted power and continuous cool air to the inlet of the electronics remains the most important goal. Thus, the cooling designs of data center facilities are a growing engineering challenge.

Figure 3:
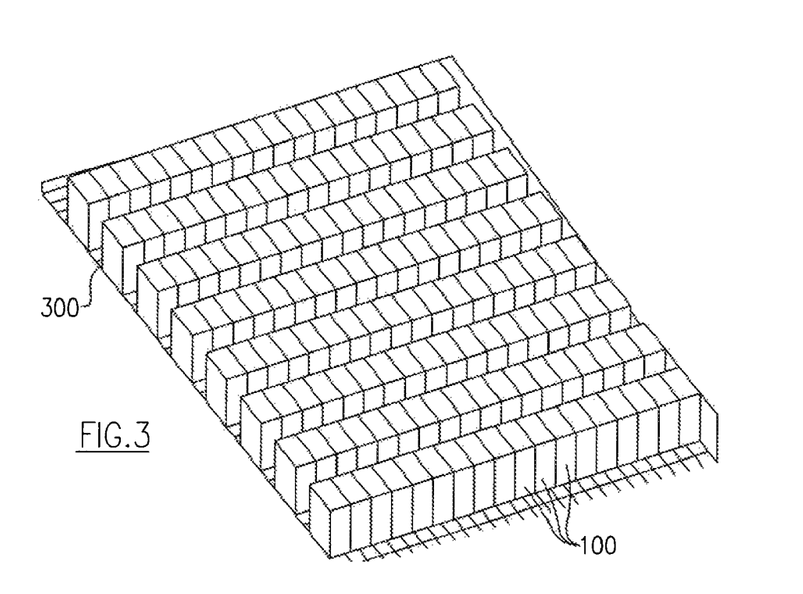
FIG. 3, provides a schematic illustration of a data center housing one or more computing racks.

FIG. 3 provides a schematic illustration of a data center 300 as will be discussed in connection with the different embodiments of the present invention. A plurality of racks all referenced as 100, are housed in the data center as shown. The racks can resemble the one used in the example of FIG. 1, or be different in structure. As shown, all racks are disposed in close proximity as is the case in conventional data centers.

In most data centers, such as the one shown in the FIG. 3, chilled air enters the room where the systems are being housed via the floor and through perforated floor tiles. The air then passes through the racks, getting heated in the process, and eventually finds its way to the intake of the air conditioning units knows as CRAC (Computer Room Air Conditioning) units (not shown). These units cool the hot air and blow it back into the under floor plenum. If only a fraction of the rack air flow rate is supplied via the perforated tiles in front of a rack, the remaining fraction of the supply side air is made up by ambient room air through mixing. This mixing and resulting recirculation can lead to complex flow patterns, and often results in significantly high rack inlet air temperatures and the violation of the equipment specification for server inlet temperature.

Figure 4A:
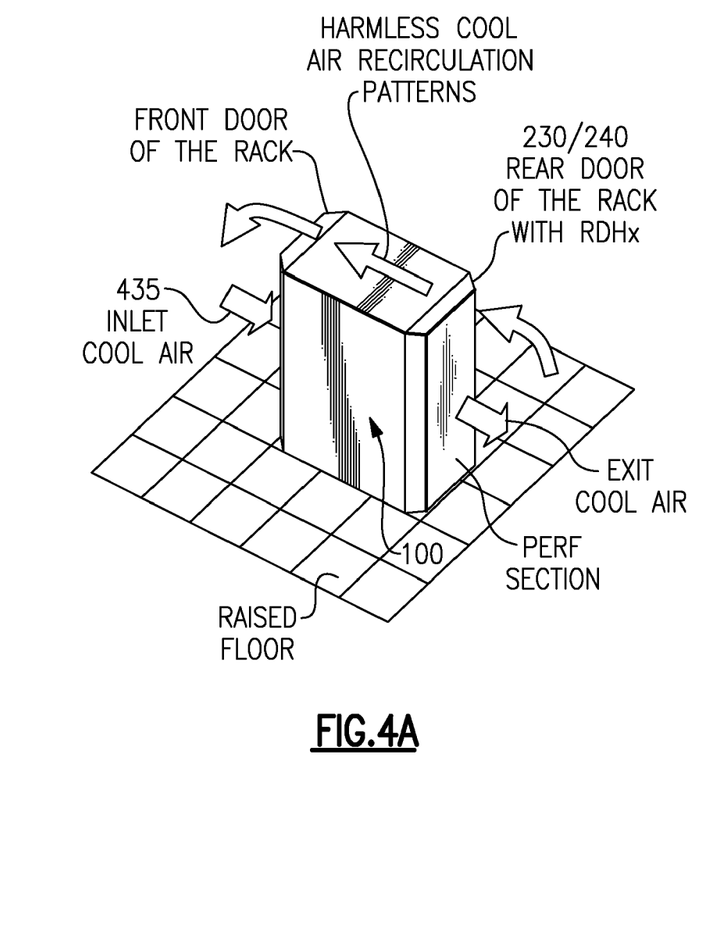
FIGS. 4(a) and 4(b) provide alternate view illustrations of computer racks as housed within the data center of FIG. 3, and incorporating a rear door heat exchanger.
Figure 4B:
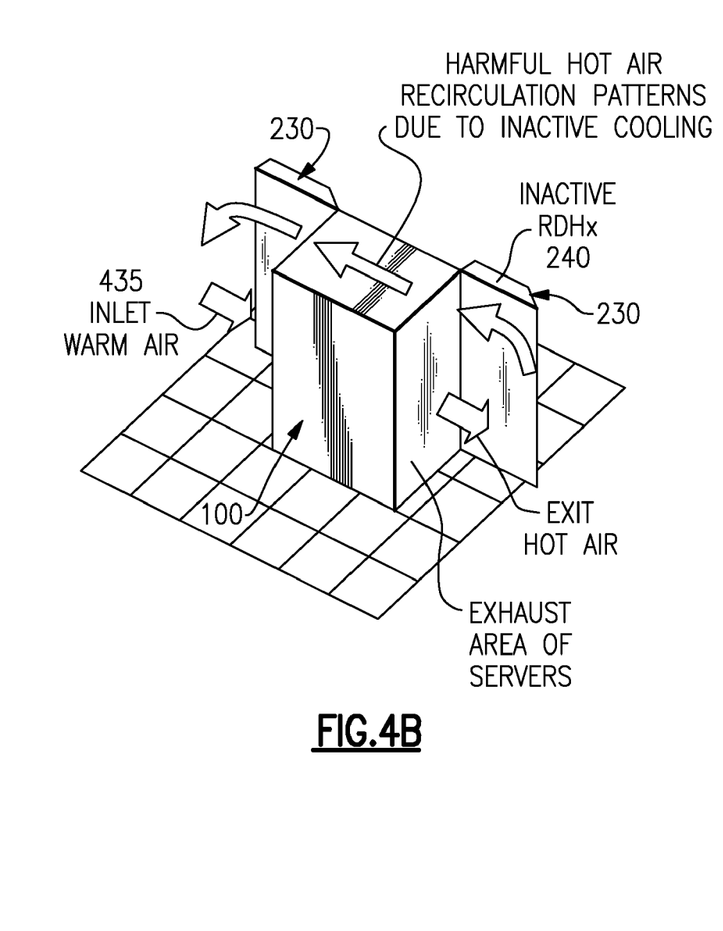

FIGS. 4(*a*) and 4(*b*) each provide an illustration of a computer rack, as housed by data center 300 (in FIG. 3), and incorporating rear door heat exchanger. FIG. 4(*a*) is an illustration of the rack during normal operation, while FIG. 4(*b*) is an illustration of the rack during maintenance operation. As shown in FIG. 4(*b*), the outlet door cover 230 is open while in FIG. 4(*a*) this door is shown in closed position. In addition, FIG. 4(*a*) provides an illustration of flow of cold air as indicated by arrows. In contrast, FIG. 4(*b*) indicates flow of warm air also as indicated by direction of the arrows. In addition, in addition the flow of air into the rack is indicated by arrow 435.

In the embodiment shown by both figures, the preferably water cooled heat exchanger 240 is disposed on the rear door of the computer rack 100, as illustrated in FIGS. 4(*a*) and 4(*b*). In one embodiment, temperature conditioned water is supplied to the heat exchangers from a coolant distribution unit or CDU (not illustrated here). The heated air passes through the water-cooled heat exchanger before exhausting to the room. Under typical conditions for high powered racks ($\geq 30$ kW), the heat exchanger removes 40% to 60% of the heat that has been added to the air by the electronics. This results in much cooler air exiting the rack thereby substantially reducing the adverse effect of air recirculation.

Figure 5A:
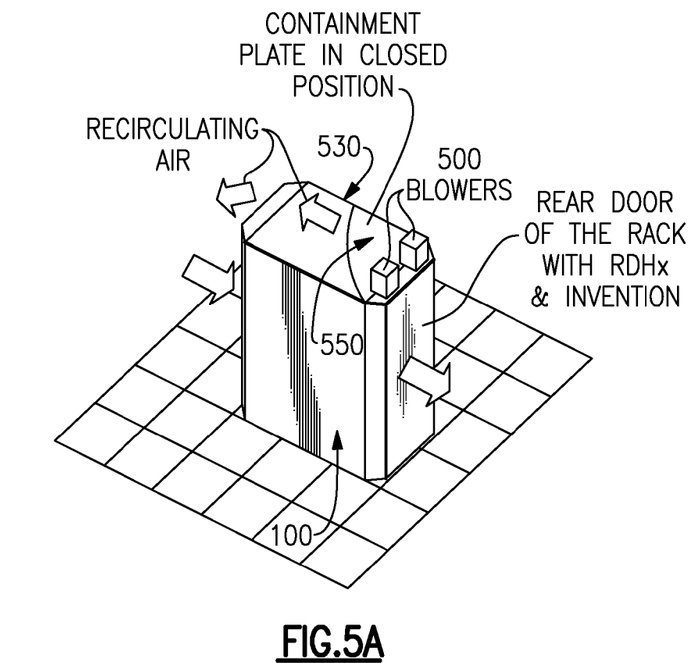
FIGS. 5(a) and 5(b) provide illustrations of one embodiment of the present invention during normal operational mode and during maintenance mode respectively.
Figure 5B:
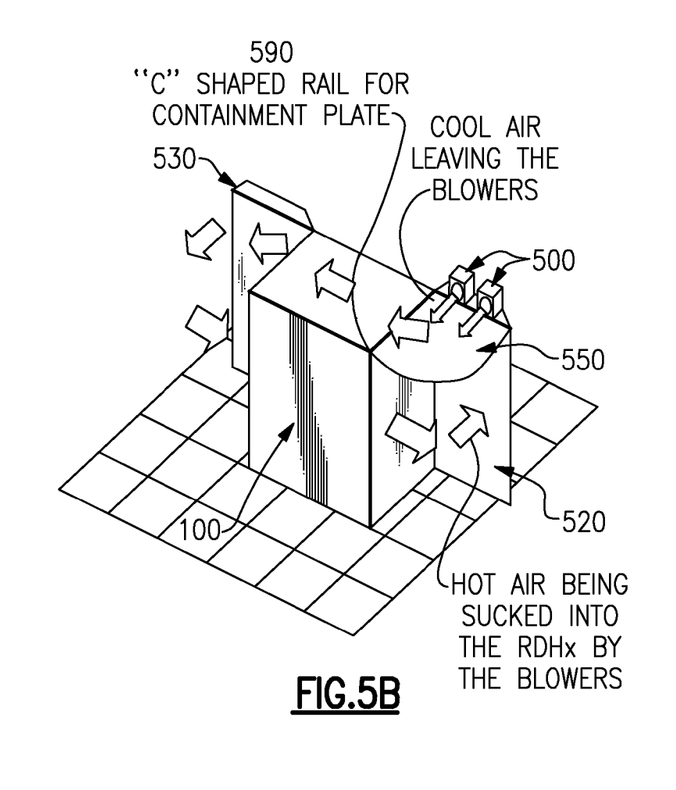

FIGS. 5(*a*) and 5(*b*) provide illustration of one embodiment of the present invention where cooling of the components is provided even during service calls. Referring back to FIG. 4(*b*) when the rear door is opened, such as during the maintenance and service calls and the present invention is not provided, the door becomes a passive structure and the cooling function is somewhat limited.

The embodiment of FIGS. 5(*a*) and 5(*b*) as will be discussed in more detail presently, not only comprises a rack 100 with a rear door heat exchanger but also additional features including a plurality of air moving devices such as a set of blowers 500, a containment plate 550, internal ducting within the rear door, and an activator, such as an electrical switch, that turns the air moving devices (i.e. blowers) on when the door is opened.

Referring to FIG. 5(*a*), the figure provides a schematic illustration of a rack 100, in a normal operating mode. The air moving devices or blowers 500 can be activated and deactivated. In the embodiment of FIG. 5(*a*), the blowers 500 are turned off and/or in the "OFF mode". The hot air exhausting the servers flows through the rear door heat exchanger getting cooled in the process and then exits the rack 100 via a perforated section 520 on the back face of the rack rear door, referenced as 530. In this particular embodiment, a plurality of air moving devices are used which in this example are shown as the two blowers (500). It is possible, however, to increase or decrease the number of these air moving devices and/or change them from one type to another as known by those skilled in the art.

In the embodiment of FIG. 5(a), the blowers are disposed and preferably attached to the top of the rear door 530 and to a containment plate 550 that is disposed in a closed position. The containment plate 550, in one embodiment, has a quarter circle shape and is made of sheet metal but in alternate embodiments, other shapes and sizes can be utilized. In addition, the containment plate 550 is attached along one of its edges to the rear door 530 as shown.

As the door is opened, as shown in FIG. 5(b), the air moving device(s) is activated. In the preferred embodiment shown in the figure, this is accomplished via turning a switch (not illustrated), such as an electrical switch. In the case of the embodiment of FIG. 5(b), the activation (i.e. of the switch) leads to the blowers being turned ON. In this manner, the hot air exhausting from the servers is sucked into the rear door heat exchanger 540 and is then cooled and expelled over the top of the containment plate 550 so as to find its way back to the inlet of the rack. In addition, as shown in FIG. 5(b), the containment plate 550 is illustrated to be in the open position. This allows the plate 550 to shepherd the hot air into the heat exchanger and also isolate the hot and cold air streams appropriately. The air is expelled from the blowers and makes its way back to the rack inlet due to suction at the rack inlet from the air moving devices in the servers themselves, and also the general direction that the air is blown from the blowers. It should be noted that the air moving device used here is referenced to as blowers, but as known to those skilled in the art, other kinds of devices such as axial fans or centrifugal blowers or any other kind of air moving device can be substituted.

In an alternate embodiment, the blowers or other air moving device used can also be angled selectively so as to optimally direct the air in a direction that is more aligned with the rack inlet.

In the embodiment(s) provided in FIGS. 5(a) and 5(b), the containment plate 550 is secured to a curved, almost "C" shaped rail 590 that is attached to the top surface of the rack. The rail 590 is used to guide the movement of the containment plate 550. In the closed position, it ensures that this plate (550) is held in place and as the door is opened the rails serve to guide the containment plate 550 as it shifts to its new position. This curved (C-shaped rail) can be selectively altered in shape to adjust to the design of a variety of containment plate designs. In a preferred embodiment, the rail 590 can be made of sheet metal and attached to the rack via bolts or via welding although many other alternative designs are possible.

Figures 6A, 6B:
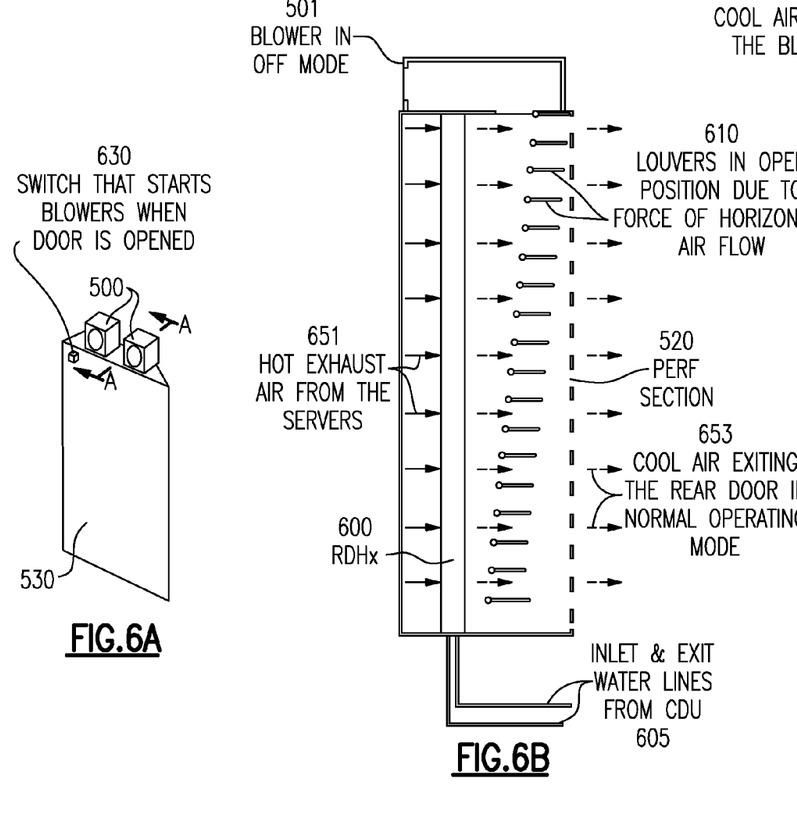
FIGS. 6(a) through 6(c) provide different schematic sectional views of the operation of the rear door as provided by embodiment of FIGS. 5(a) and 5(b)
Figure 6C:
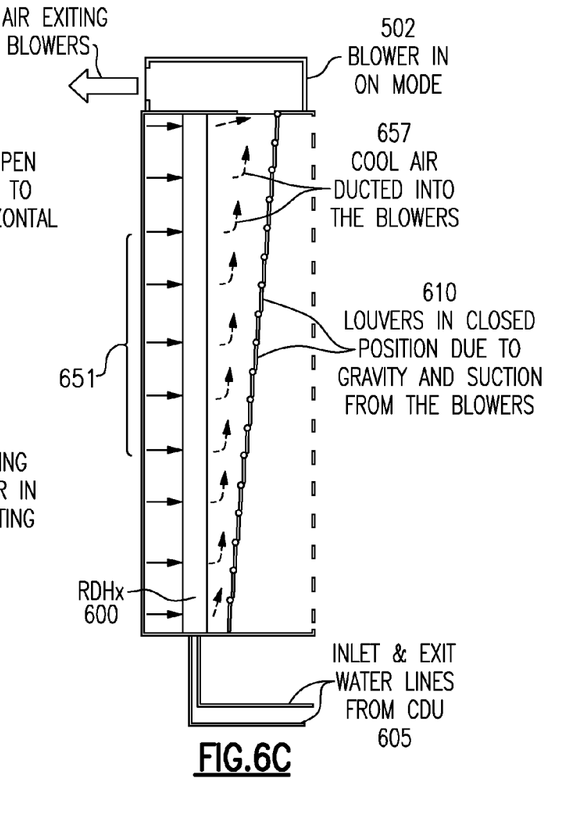

FIGS. 6(a) through 6(c) provides different schematic sectional views of a rack. In the preferred embodiment shown in these figures, a cooling rear door unit 530 is provided. FIG. 6(a) provides a perspective view of just the rack rear door 530. Prominently displayed in FIG. 6(a) is the electrical switch 630 (in the top left hand corner, in this figure) which serves to trigger the blowers 500 to turn ON as soon as the door 530 is opened. FIGS. 6(b) and 6(c) each provide a view across the sectional line A-A of FIG. 6(a). The difference between the schematic view provided in FIGS. 6(b) and 6(c), however, is that FIG. 6(b) is an illustration of the embodiment presented during normal rack operating mode, while FIG. 6(c) provides an illustration of the rack during a maintenance mode or operation. In this respect, FIGS. 6(b) and 6(c) provide the same two scenarios that were depicted in the embodiment of FIGS. 5(a) and 5(b), respectively, namely, the normal operating mode (5(a)), and the maintenance or servicing mode (5(b)).

Referring back to FIG. 6(b), the rack rear door 530 is closed and the blowers 500 are switched OFF and referenced now as 501. The hot exhaust air from the servers flows past the heat exchanger thus getting cooled in the process as shown by arrows 651. In a preferred embodiment, a plurality of louvers 610 are provided as shown. After the cool air leaves the heat exchanger, it flows through in a preferred embodiment through one or more horizontal open louvers 610 which are held open by the force from the flowing air. These louvers 610 serve to allow the air to exit the rack rear door 530 from the conventional perforated back plane 520 into the ambient room as shown by arrows 653. In a preferred embodiment, as shown, to provide maximum cooling a rear door heat exchanger such as provided by IBM's Cool Blue technology is provided as referenced by numerals 600, but this is not a requirement for the workings of the present invention. The heat exchanger 600 uses inlet and outlet coolant, such as facility water, as shown and referenced by numerals 605.

In contrast, in FIG. 6(c), the door 530 has now been opened, triggering the blowers to switch ON as referenced as 502. The air suction from the blowers forces the louvers 610 to close and seal any path for air to enter or exit the trapezoidal plenum shown as referenced by arrows 657. Gravity also assists in closing of the louvers 610. Thus, in FIG. 6(c), the hot air 651 is sucked in through the heat exchanger 600 of the door and the cooled air is then sucked via a 90 degree turn into the blowers 502 and then expelled out at the top of the racks, over the containment plate 550 (see FIG. 5). The duct at the exit of the heat exchanger is preferably trapezoidal as shown so as to mitigate flow non-uniformity.

Figure 7A:
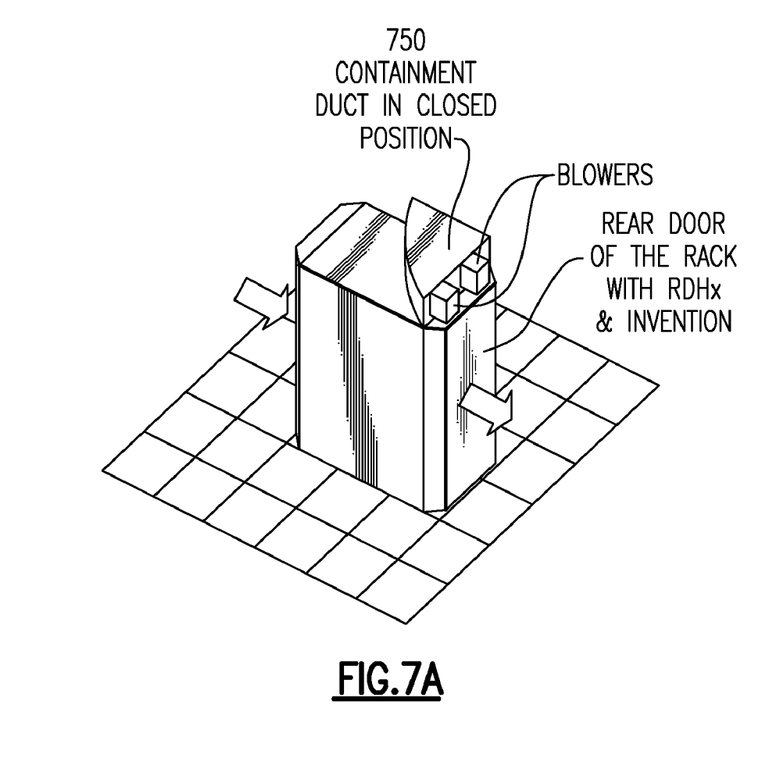
FIGS. 7(a) and 7(b) provide schematic illustration of an alternate embodiment of the present invention during normal and maintenance operational modes, respectively.
Figure 7B:
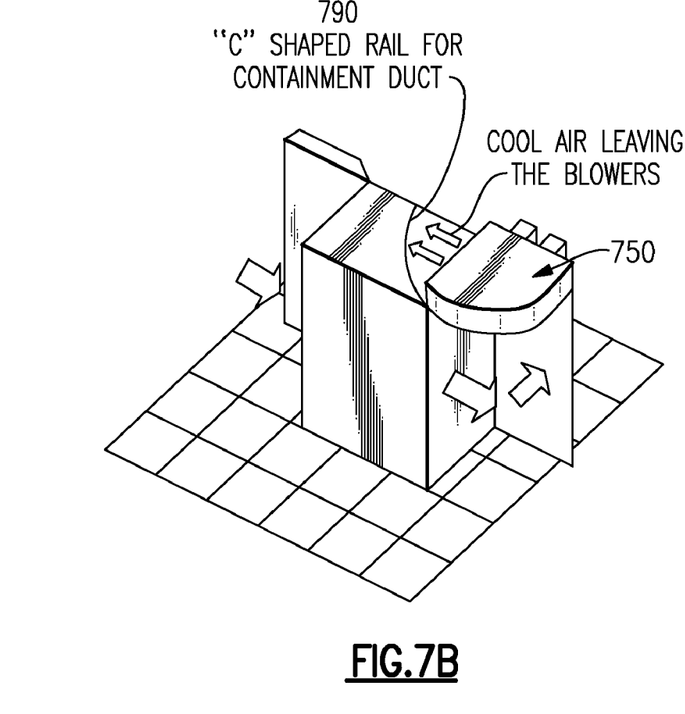

FIGS. 7(a) and 7(b) provide illustrations of an alternate embodiment of the present invention. FIG. 7(a) provides an illustration of the rack during normal operational mode, while FIG. 7(b) provides an illustration of the same rack during maintenance mode. In these alternate embodiment(s), the planar containment plate (previously referenced as 550) of the previous embodiment is replaced with a three dimensional hinged rotating duct of the same general shape, as shown and referenced as 750.

One advantage of using such a movable duct is that the duct will ensure that the air is expelled right over the top of the rack in a direction that is parallel to the length of the rack. Using such a duct could also ensure greater protection from mixing between the hot and cold air streams. In a preferred embodiment, curved or "C" shaped railings 790 can be provided as before for ensuring proper guiding of the duct during the opening and closing function.

While the preferred embodiment of the invention has been described, it will be understood that those skilled in the art, both now and in the future, may make various improvements and enhancements which fall within the scope of the claims which follow. These claims should be construed to maintain the proper protection for the invention first described.

What is claimed is:

1. An apparatus for cooling electronic components housed in a computer rack for providing cooling during performance of maintenance operations, comprising:

a heat exchange assembly comprising an air-to-liquid heat exchanger disposed within an outlet door of said computer rack, the outlet door being pivotably mounted to an air outlet side of the computer rack;

the outlet door comprising a plurality of louvers which open or close with the closing or opening of the outlet door, respectively, the air-to-liquid heat exchanger being mounted in the outlet door such that when the outlet door is closed, egressing exhaust air from the air outlet side of the computer rack passes across the air-to-liquid heat exchanger before passing through the plurality of louvers;

at least one air moving device(s) disposed on said outlet door;

an activator for activating the at least one air moving device(s) with the opening of the outlet door and deactivating the at least one air moving device(s) with the closing of the outlet door;

the at least one air moving device(s) being disposed such that when activated, exhaust air egressing from the air outlet side of the computer rack is drawn across the air-to-liquid heat exchanger; and a containment plate secured to a top of said the outlet door and disposed to facilitate exhaust air egressing from the air outlet side of the computer rack being drawn through the air-to-liquid heat exchanger when the outlet door is opened and the at least one air moving device(s) is activated, and to inhibit the exhaust air from returning directly to an air inlet side of the computer rack without passing through the at least one air moving device(s).

2. The apparatus of claim 1, wherein the at least one air moving device(s) comprises at least one blower.

3. The apparatus of claim 2, wherein the at least one air moving device(s) comprises at least one centrifugal blower(s).

4. The apparatus of claim 1, wherein the at least one air moving device(s) comprises at least one axial fan(s).

5. The apparatus of claim 1, wherein the outlet door includes internal ducting facilitating directing of exhaust air egressing from the air outlet side of the computer rack across the air-to-liquid heat exchanger when the outlet door is closed.

6. The apparatus of claim 5, wherein the containment plate is wedge-shaped.

7. The apparatus of claim 6, wherein the containment plate is fabricated of sheet metal.

8. The apparatus of claim 7, wherein the activator comprises a switch.

9. The apparatus of claim 1, wherein the at least one air moving device(s) is attached to a top of the outlet door.

10. The apparatus of claim 1, wherein the containment plate is secured to the computer rack via a guiding rail.

11. The apparatus of claim 10, wherein guiding rail is curved.

12. The apparatus of claim 11, wherein guiding rail is a "C" shaped structure.

13. The apparatus of claim 1, wherein, with the outlet door open and the plurality of louvers closed, the outlet door comprises an internal trapezoidal plenum configured to guide exhaust air upwards after passing across the air-to-liquid heat exchanger.

14. A method of cooling electronic components housed in a computer rack during maintenance operations, comprising:

providing an outlet door comprising a plurality of louvers which open or close with the closing or opening of the outlet door, respectively, the outlet door being pivotably mounted to an air outlet side of the computer rack;

providing a heat exchange assembly comprising an air-to-liquid heat exchanger mounted to the outlet door of the computer rack, wherein when the outlet door is closed, egressing exhaust air from the air outlet side of the computer rack passes across the air-to-liquid heat exchanger before passing through the plurality of louvers and egressing from the outlet door;

securing at least one air moving device(s) to a top of the outlet door;

providing an activator for activating the at least one air moving device(s) with the opening of the outlet door and deactivating the at least one air moving device(s) with the closing of the outlet door, the at least one air moving device(s) being disposed such that when activated, exhaust air egressing from the air outlet side of the computer rack is drawn across the air-to-liquid heat exchanger; and providing a containment plate secured to the top of the outlet door and disposed to facilitate exhaust air egressing from the air outlet side of the computer rack being drawn through the air-to-liquid heat exchanger when the outlet door is open and the at least one air moving device(s) is activated, and to inhibit the exhaust air from returning directly to an air inlet side of the computer rack without passing through the at least one air moving device(s).

* * * * *